US009202953B1

(12) United States Patent
Cheng et al.

(10) Patent No.: US 9,202,953 B1
(45) Date of Patent: Dec. 1, 2015

(54) METHOD FOR MANUFACTURING SOLAR CELL WITH NANO-STRUCTURAL FILM

(71) Applicant: NATIONAL CHENG KUNG UNIVERSITY, Tainan (TW)

(72) Inventors: Yu-Shun Cheng, Tainan (TW); Chie Gau, Tainan (TW); Chi-Feng Chang, Tainan (TW); Chih-Hung Chuang, Tainan (TW); Yu-Cheng Hong, Tainan (TW); Kai-Hung Chen, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 14/279,501

(22) Filed: May 16, 2014

(51) Int. Cl.
*H01L 21/00* (2006.01)
*H01L 31/0236* (2006.01)
*H01L 31/0232* (2014.01)

(52) U.S. Cl.
CPC .... *H01L 31/02366* (2013.01); *H01L 31/02327* (2013.01)

(58) Field of Classification Search
USPC .......................................................... 438/69
See application file for complete search history.

(56) References Cited

U.S. PATENT DOCUMENTS

| 2010/0080954 | A1* | 4/2010 | Mohseni | G03F 7/20 428/131 |
| 2011/0168969 | A1* | 7/2011 | Wang | B82Y 10/00 257/10 |
| 2011/0294295 | A1* | 12/2011 | Zhu | B81C 1/00031 438/694 |
| 2012/0247558 | A1 | 10/2012 | Hsu et al. | |
| 2013/0213477 | A1* | 8/2013 | Nakayama | H01L 51/442 136/263 |
| 2013/0220412 | A1* | 8/2013 | Hatton et al. | 136/256 |
| 2014/0174521 | A1* | 6/2014 | Wang | C03C 17/2453 136/256 |
| 2014/0242343 | A1* | 8/2014 | Free | B44C 1/17 428/164 |
| 2014/0373898 | A1* | 12/2014 | Rogers et al. | 136/246 |
| 2015/0075608 | A1* | 3/2015 | Abou-Kandil | H01L 31/02366 136/256 |

FOREIGN PATENT DOCUMENTS

TW 201215490 A 4/2012
TW 201242058 A 10/2012

OTHER PUBLICATIONS

Communication From the Taiwan Patent Office Regarding a Counterpart Foreign Application Dated (Taiwan Year 104) Jul. 23, 2015.

* cited by examiner

*Primary Examiner* — Asok K Sarkar
(74) *Attorney, Agent, or Firm* — Rosenberg, Klein & Lee

(57) ABSTRACT

The invention relates to a method for manufacturing a solar cell with a nanostructural film, including steps of treating a glass substrate with UV ozone, uniformly coating a polystyrene nanospherical layer containing plural nanospheres on the surface of the glass substrate and curing the polystyrene nanospherical layer for adhesion onto the glass substrate, forming a first optical layer on the surface of the polystyrene nanospherical layer, curing and releasing the first optical layer from the polystyrene nanospherical layer to obtain a concave spherical nanostructured film, and finally affixing the concave spherical nanostructured film on the surface of a solar cell to manufacture a solar cell with nanostructure after curing by baking.

12 Claims, 15 Drawing Sheets

METHOD FOR MANUFACTURING SOLAR CELL WITH NANO-STRUCTURAL FILM

BACKGROUND OF THE INVENTION

1. Fields of the Invention

The present invention relates to a method for manufacturing a solar cell with a nanostructural film especially by means of an optical layer. The method of the present invention can be repeatedly done in a general environment without special and expensive equipment or devices. The nanostructural film can be directly affixed on the surface of the solar cell so that the solar cell generates the light concentration effect to increase routes through which the light inside the solar cell travel, effectively reduce the light reflectivity and enhance the photoelectric conversion efficiency thereof.

2. Descriptions of Related Art

The sun is the source of life, and human being cannot live without the sun. Although there are no immediately exhausted crises for the fossil fuels, e.g. oil or coal, on which the life around the world rely, the carbon dioxide emission from the excessive use of the fossil fuel has already caused the serious greenhouse effect to become the culprit in the earth's warming temperatures. Furthermore, since the price of crude oil continued to rise in recent years and nuclear power plant safety concern, looking for alternative energy sources has become imperative. Alternative energy sources, such as wind, hydro, geothermal, biodiesel, solar cells and so on, to be called as green energy, have attracted considerable attention over recent years, among which the solar cell is the most promising due to its high theoretical efficiency and mature technology.

The solar cell can transform the solar energy into electrical energy based on the photoelectric effect of materials. The photoelectric effect is the phenomenon that light shines into the material to increase conductive carriers. In terms of the semiconductor materials, as the energy of the light is larger than the energy gap of the semiconductors, the free elector-hole pairs are generated in the interior. However, these elector-hole pairs can be recombined soon or captured by the carriers in the semiconductors to become vanished. If an internal electric field is applied at this time, the carriers will be quickly led out before vanished. The internal electric field is generated in the joint interface between p-type and n-type semiconductors, and a so-called solar cell uses the internal electric field to extract effectively the current to induce the electricity.

However, currently the biggest problem of the solar cell is that its luminous efficiency cannot continuously be improved. When light shines on the surface of the solar cell, the large difference between the refractive index of air (refractive index, n=1) and of silicon substrate (refractive index, n=3.42) will generate a large amount of Fresnel reflection; in other word, part of the incident light is straightly reflected and the rest thereof is absorbed by the solar cell to generate electron-hole pairs. This factor not only causes an unideal photoelectric conversion efficiency of the solar cell but also increases power generation cost to obstruct the application and development of the solar cell in daily life.

In order to change the direction of the incident light from direct to oblique to reduce the surface reflection and increase the amount of light absorbed by solar cell, the single layer or multiple layers of the dielectric materials with the refractive index between that of the substrate and of air are coated on the surface of the traditional solar cell, for example, silicon nitride ($Si_3N_4$), silicon oxide ($SiO_x$), and titanium oxide ($TiO_x$). The method of destructive interference is used to achieve the effect of anti-reflection by the traditional solar cell and to enhance the photoelectric conversion efficiency. However, the traditional manufacturing processes for films must be done in a high vacuum environment e.g. semiconductor clean rooms. The thickness of films must be precisely controlled in the traditional manufacturing processes. Films with an adequate refractive index are lacking for use in the traditional manufacturing processes. All the aforesaid are the main disadvantages for the traditional processes for making solar cells. Applications of anti-reflection films on the solar cell are thus substantially restricted due to such traditional processes for making solar cells.

SUMMARY OF THE INVENTION

Therefore, in order to effectively manufacture a nanostructural film to be affixed on a solar cell under a simplified process at a low cost, enhance the photoelectric conversion efficiency of the solar cell and reduce the light reflection, a primary goal of the present invention is to provide a method for manufacturing a solar cell with a nanostructural film, especially by use of an optical layer. The method of the present invention can be repeatedly done in a general environment without special and expensive equipment or devices. The nanostructural film can be directly affixed on the surface of the solar cell so that the solar cell generates the light concentration effect to increase routes through which the light inside the solar cell travel, effectively reduce the light reflectivity and enhance the photoelectric conversion efficiency thereof.

In order to achieve the above objectives, a method for manufacturing a solar cell with a nanostructural film is present herein to increase the absorption of light in the solar cell, wherein the nanostructural film is formed in an imprint molding process. The present invention includes following steps as treating a glass substrate with UV ozone, uniformly coating a polystyrene nanospherical layer containing plural nanospheres on the surface of the glass substrate and curing the polystyrene nanospherical layer for adhesion onto the glass substrate, forming a first optical layer on the surface of the polystyrene nanospherical layer, curing and releasing the first optical layer from the polystyrene nanospherical layer to obtain a concave spherical nanostructured film, and finally affixing the concave spherical nanostructured film on the surface of a solar cell to manufacture a solar cell with nanostructure after curing by baking.

After the step of preparing the concave spherical nanostructured film, a second optical layer can be further formed on the surface of the concave spherical nanostructured film, cured via a baking process and released from the concave spherical nanostructured film to become a concave spherical nanostructured film.

The second optical layer is made of ethylene vinyl acetate (EVA) or poly(dimethylsiloxane) (PDMS), whose refractive indexes is between those of the substrate and air, preferably ranging from 1.4 to 1.45.

When the second optical layer is made of PDMS, an adhesion layer is further uniformly spin coated on the surface of the solar cell before the convex spherical nanostructured film is affixed on the surface of the solar cell, wherein the adhesion layer is made of PDMS as well.

The first optical layer is made of ethylene vinyl acetate (EVA) or poly(dimethylsiloxane) (PDMS), whose refractive indexes is between those of the substrate and air, preferably ranging from 1.4 to 1.45.

When the first optical layer is made of PDMS, the adhesion layer is further uniformly spin coated on the surface of the solar cell before the concave spherical nanostructured film us affixed on the surface of the solar cell, wherein the adhesion layer is made of PDMS as well.

The UV ozone is a cleaning technology for cleaning the surface of the glass substrate, so that the glass substrate has a hydrophilic surface to make polystyrene nanospheres attach to it.

Each of the polystyrene nanospheres has a diameter ranging from 140 nm to 2 um.

The first or second optical layer or the concave spherical nanostructured film on the solar cell can be cured via a baking process at a temperature ranging from 90° C. to 110° C.

Accordingly, the present invention uses a mold having a nanostructured surface to prepare the nanostructural film by imprint molding in cooperation with optical layers each having a refractive index between those of the substrate and air. The nanostructural film can be directly affixed on the surface of the solar cell so that the solar cell generates the light concentration effect to increase routes through which the light inside the solar cell travel, effectively reduce the light reflectivity and enhance the photoelectric conversion efficiency thereof. In addition, the present invention uses materials of ethylene vinyl acetate (EVA) or poly(dimethylsiloxane) (PDMS) to prepare the optical layers in manufacture of the nanostructured film. Unlike traditional nanostructures mostly manufactured by the lithography process of the semiconductor industry, the method of the present invention can be repeatedly done in a general environment without special and expensive equipment or devices; in other words, it is simplified to save much more costs for manufacturing solar cells. Furthermore, a concave or convex spherical manostructural film or other films having various spherical nanostructures can be used in the present invention to enhance the photoelectric conversion efficiency of the solar cell. Owing to no significant results for use of concave spherical nanostructure or convex spherical nanostructure in enhancing the photoelectric conversion efficiency of the solar cell, either light gathering or light scattering enable to increase routes of light to further enhance the light absorption and effectively improve the current density of the solar cell.

BRIEF DESCRIPTION OF THE DRAWINGS

The structure and the technical means adopted by the present invention to achieve the above and other objects can be best understood by referring to the following detailed description of the preferred embodiments and the accompanying drawing, wherein.

DETAILED DESCRIPTION OF THE PREFERRED EMBODIMENT

First, about the following description of the embodiment, it should be understood that when a layer (or a film) or a structure is deposited on or under another substrate, another layer (or film) or another structure, it can be directly disposed in the other substrate, layer (or film), or another structure, or indirectly disposed on more than one intermediate layers between both. Please refer to the location of each layer in brief description of the figures.

Figure 1:
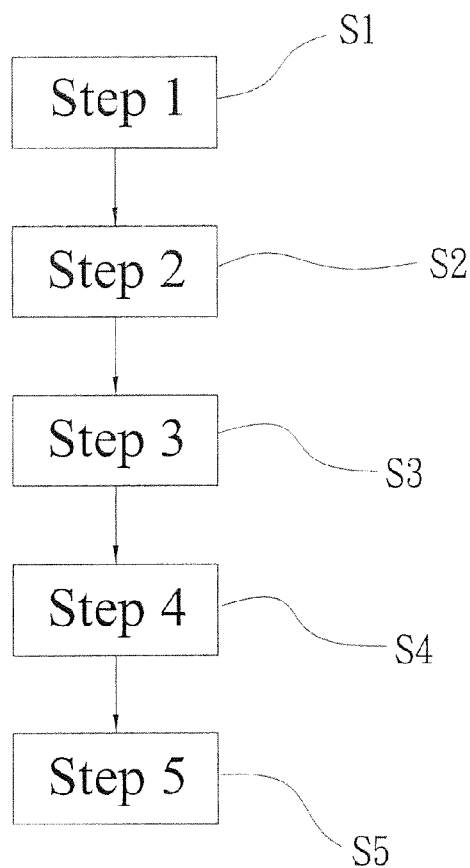
FIG. 1 is a flow chart showing steps of an embodiment of a method for manufacturing a solar cell with a nanostructural film according to the present invention.

As referring to FIG. 1, a flow chart showing steps of an embodiment of a method for manufacturing a solar cell with a nanostructural film according to the present invention, wherein the first optical layer, second optical layer and adhesion layer in the embodiment of a method for manufacturing a solar cell are made of poly(dimethylsiloxane) (PDMS), the manufacturing method includes following steps.

Figure 2:
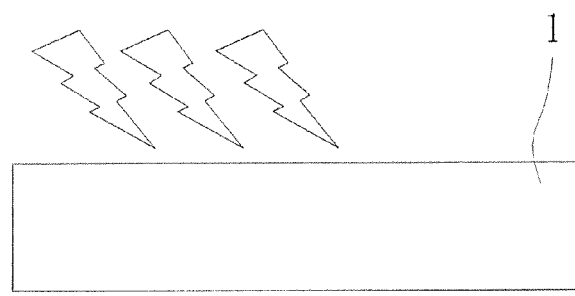
FIG. 2 is a schematic drawing showing a UV-ozone treated substrate of an embodiment of a method for manufacturing a solar cell with a nanostructural film according to the present invention.
Figure 3:
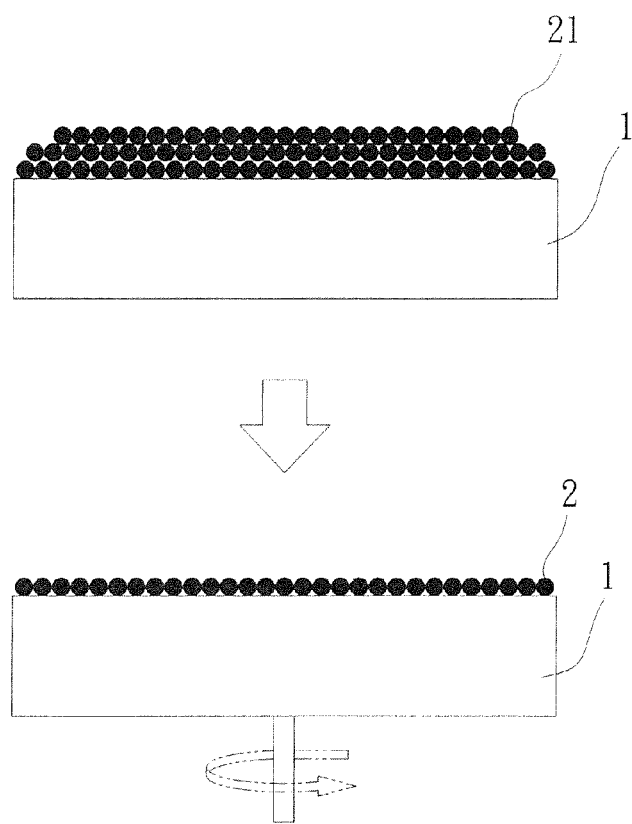
FIG. 3 is a schematic drawing showing a spin coating of polystyrene nanospheres of an embodiment of a method for manufacturing a solar cell with a nanostructural film according to the present invention.
Figure 4:
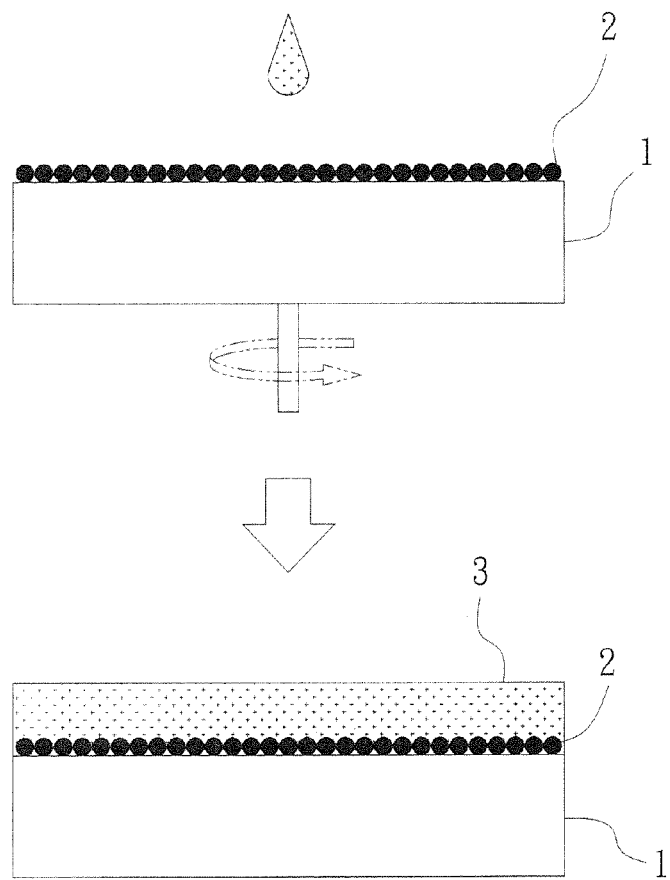
FIG. 4 is a schematic drawing showing formation of a first optical layer of an embodiment of a method for manufacturing a solar cell with a nanostructural film according to the present invention.
Figure 5:
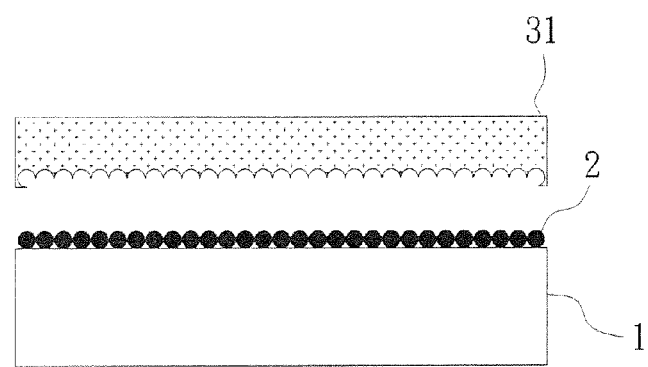
FIG. 5 is a schematic drawing showing formation of a concave spherical nanostructured film of an embodiment of a method for manufacturing a solar cell with a nanostructural film according to the present invention.
Figure 6:
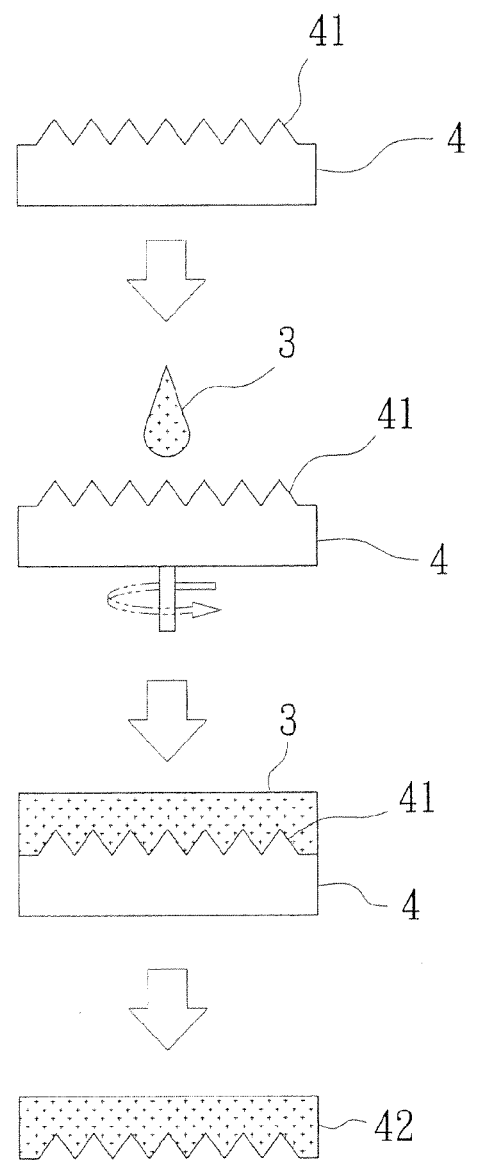
FIG. 6 is a schematic drawing showing formation of a pyramid spherical nanostructured film of an embodiment of a method for manufacturing a solar cell with a nanostructural film according to the present invention.
Figure 7:
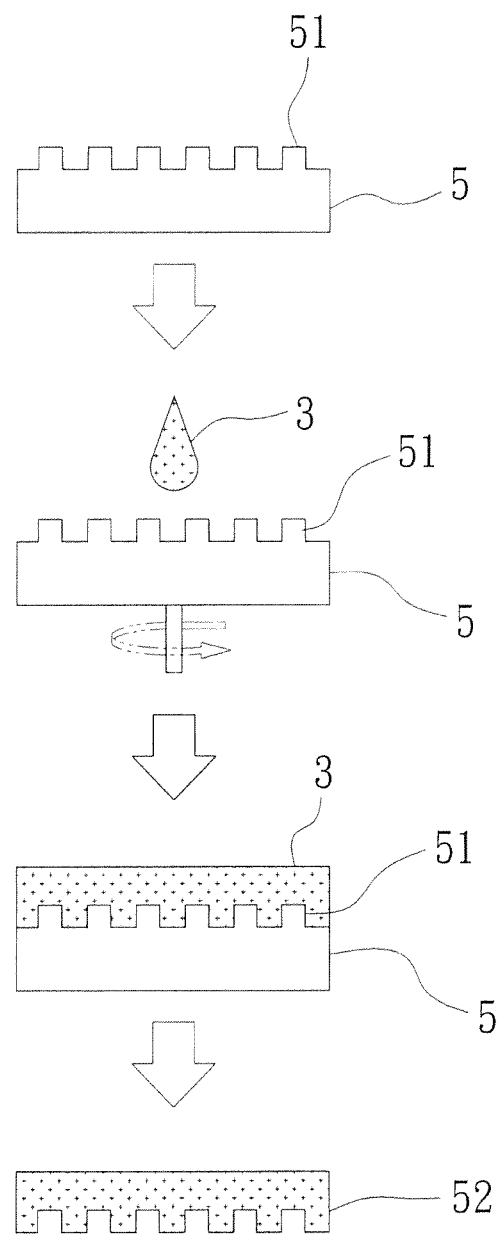
FIG. 7 is a schematic drawing showing formation of a raster spherical nanostructured film of an embodiment of a method for manufacturing a solar cell with a nanostructural film according to the present invention.

Step one (S1): treating a glass substrate (1) with UV ozone; as referring to FIG. 2, a schematic drawing showing a UV-ozone treated substrate of an embodiment of a method for manufacturing a solar cell with a nanostructural film according to the present invention, wherein UV ozone is a dry cleaning technology, it does not need to use any solvent, so it is a very efficient and precision cleaning technology. UV ozone is commonly used technology to clean the substrate of the silicon wafer or LCD, it not only does not damage the surface of the wafer or substrate, but also a very important technology for surface modification. The UV ozone cleaning technology can be carried out at ambient temperature, it can effectively remove low density contaminants to obtain a super clean surface. It also has the advantages of easy operation and low maintained cost, and it makes the cleaning surface of the wafer or glass substrate (1) as a hydrophilic surface. The cleaning time of UV ozone is 3 minutes in the preferred embodiment of the present invention, the topic is that the glass substrate (1) has a hydrophilic surface, so that polystyrene nanospheres (21) of the subsequent process are gathered and adhered to the glass substrate (1);

Step two (S2): uniformly coating a polystyrene nanospherical layer (2) containing plural polystyrene nanospheres (21) on the surface of the glass substrate (1) and curing the polystyrene nanospherical layer for adhesion onto the glass substrate (1); as referring to FIG. 3, a schematic drawing showing a spin coating of polystyrene nanospheres of an embodiment of a method for manufacturing a solar cell with a nanostructural film according to the present invention, wherein the present invention uses a spin coater to coat the polystyrene nanospheres (21) on the surface of the glass substrate (1). The polystyrene nanospheres (21) in the preferred embodiment of the present invention has a diameter ranging from 140 nm to 2 um, and the different size of the polystyrene nanospheres (21) collocated with different speed of spin coating can make the polystyrene nanospheres (21) uniformly gather on the surface of the glass substrate (1). Taking 140 nm and 2 um of the polystyrene nanospheres (21) as example, 140 nm polystyrene nanospheres (21) can be uniformly gathered on the surface of the glass substrate (1) at 7000 rpm for 30 seconds, and 2 um polystyrene nanospheres (21) finish at 1000 rpm for 50 seconds. Finally, the polystyrene nanospheres (21) are adhered onto the glass substrate (1) with 110° C. curing;

Step three (S3): forming a first optical layer (3) on the surface of the polystyrene nanospherical layer (2); the first optical layer (3) is a dielectric material whose refractive index is between those of the glass substrate (1) and air. The first optical layer (3) in the preferred embodiment of the present invention is made of poly(dimethylsiloxane) (PDMS) with refractive index preferably ranging from 1.4 to 1.45, wherein PDMS is a polymeric organosilicon compound and commonly referred to as an organic silicon, it has an optical transparency characteristic, and it is consider as the material of inert, non-toxic and non-flammable, and it is widely used silicon-based organic polymer. When liquid, PDMS is a viscous liquid, known as silicone oil, and it is in solid after curing by baking. The solid PDMS is a silicone with the characteristics of non-toxic, hydrophobic and inert, and it is a non-flammable transparent elastomer. The manufacturing process of PDMS is simple and fast, the material cost is much lower than a silicon wafer, and it has a good light transmission, good biocompatibility and easily engagement with a variety of materials at room temperature. Because it has high structural flexibility due to lower young's module, it is often used in a microfluidic system of bio-MEMS, a soft lithography process and nanostructure manufacturing, and it has wide range of applications. As referring to FIG. 4, a schematic drawing showing formation of a first optical layer of an embodiment of a method for manufacturing a solar cell with a nanostructural film according to the present invention, wherein the first optical layer (3) in the preferred embodiment of the present invention is uniformly coated on the surface of the polystyrene nanospherical layer (2) at 1000 rpm for 30 seconds in the spin coater. However, it is worth noting that ethylene vinyl acetate (EVA) can be selected as the material of the first optical layer (3) in another embodiment of the present invention, wherein EVA is a new hot melt adhesive film used in the package of the solar cell. Ethylene vinyl acetate is a raw material, after adding various assistants and heating extrusion, it can be applied in the general monocrystalline silicon and polycrystalline silicon solar cell and the module of the thin-film solar cell. EVA has the advantages of durability, high adhesion strength, high transparency and low shrinkage, and contributes to the highest efficiency performance of solar cell module;

Step four (S4): curing and releasing the first optical layer (3) from the polystyrene nanospherical layer (2) to obtain a concave spherical nanostructured film (31); as referring to FIG. 5, a schematic drawing showing formation of a concave spherical nanostructured film of an embodiment of a method for manufacturing a solar cell with a nano structural film according to the present invention, wherein the curing has a temperature ranging from 90° C. to 110° C., and the time is ranging from 30 minutes to 1 hour. The process condition of the preferred embodiment in the present invention is at 90° C. for 1 hour. In addition, since the main principle of the present invention makes the action of imprint a molding with nanostructure, wherein the molding with nanostructure is an optical diffuser plate (4), a DVD disc (5) and polystyrene nanospheres (21) and without limitation to the generality of the foregoing. As referring to FIG. 6 and FIG. 7, a schematic drawing showing formation of a pyramid and a raster spherical nanostructured film of an embodiment of a method for manufacturing a solar cell with a nanostructural film according to the present invention, wherein FIG. 6 shows the preferred embodiment that the first optical layer (3) of PDMS imprints a pyramid micro-pattern (41) of the optical diffuser plate (4) to manufacture a pyramid nanostructured film (42). FIG. 7 is the preferred embodiment that the first optical layer (3) of PDMS imprints a raster micro-pattern (51) of the DVD disc (5) to manufacture a raster nanostructure film (52). Both of the manufactured results achieve the same effect as the result of the preferred embodiment in the present invention manufactured by the polystyrene nanospheres (21).

Figure 8:
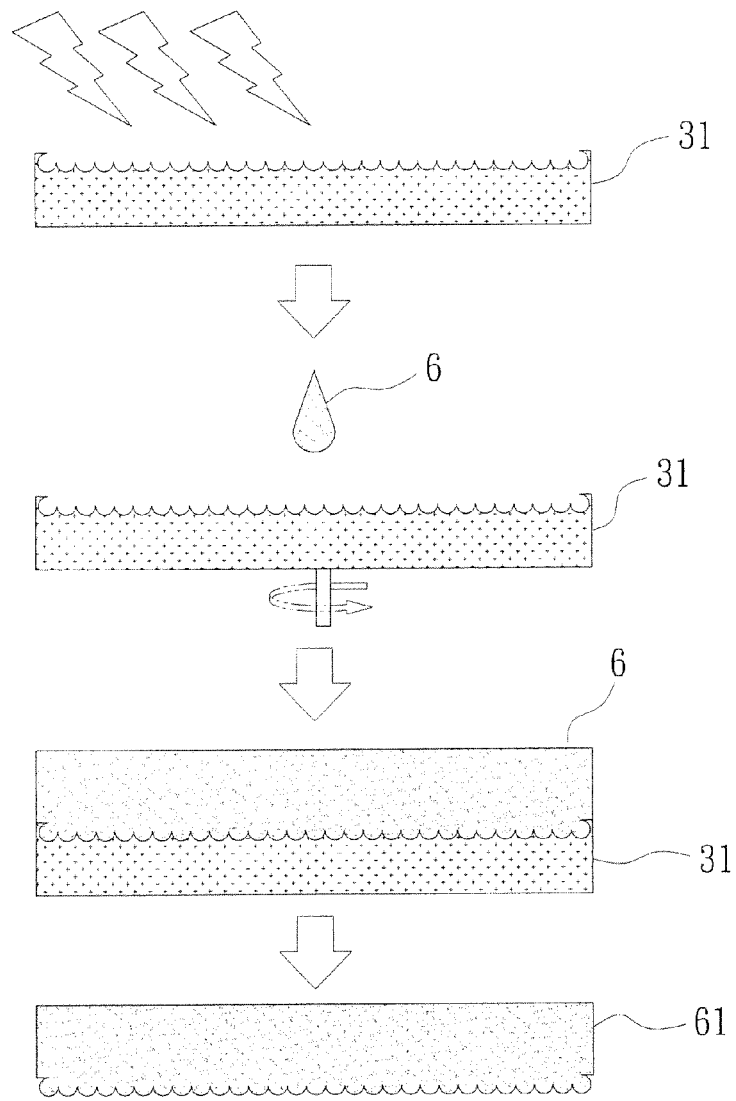
FIG. 8 is a schematic drawing showing formation of a convex spherical nanostructured film of an embodiment of a method for manufacturing a solar cell with a nanostructural film according to the present invention.
Figure 10:
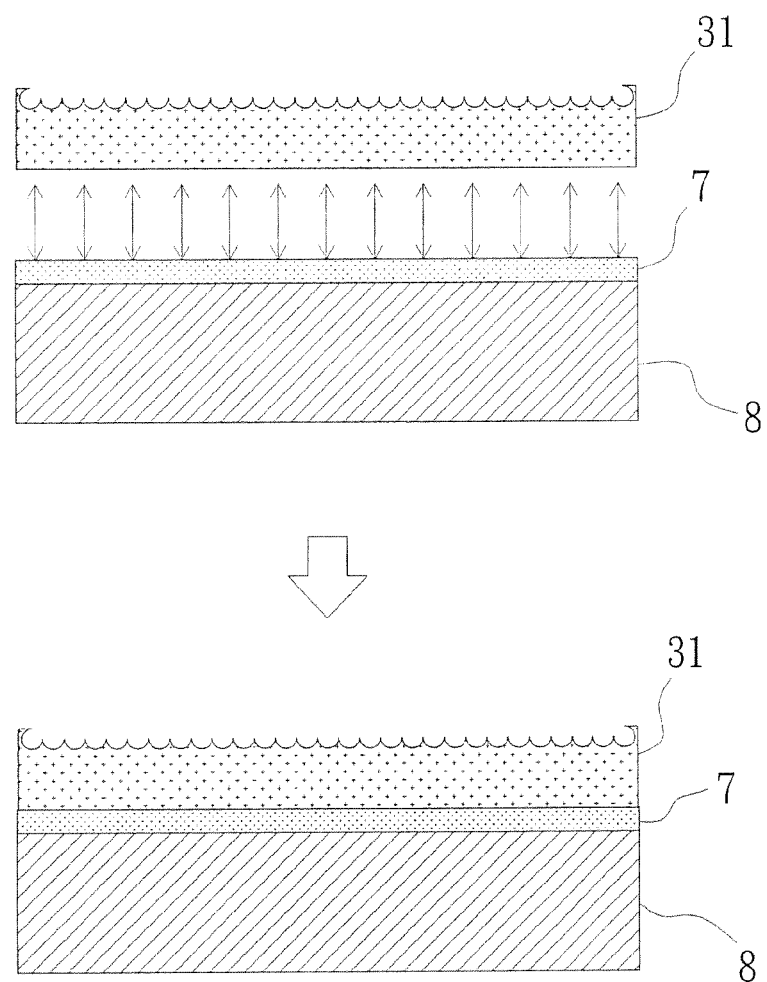
FIG. 10 is a schematic drawing for formation of a solar cell of an embodiment of a method for manufacturing a solar cell with a nanostructural film according to the present invention.

Furthermore, as referring to FIG. 8, a schematic drawing showing formation of a convex spherical nanostructured film of an embodiment of a method for manufacturing a solar cell with a nanostructural film according to the present invention. After the step four (S4) of preparing the concave spherical nanostructured film (31), the surface can be further treated 3 minutes by UV ozone, then a second optical layer (6) is coated on the surface at 500 rpm for 30 seconds, cured via a baking process at 90° C. for 1 hour and released from the concave spherical nanostructured film (31) to become a convex spherical nanostructured film (61). The second optical layer (6) is made of PDMS or EVA the same as the first optical layer (3). Therefore, the polystyrene nanospheres (21) adhered on the glass substrate (1) in the embodiment of the present invention as the molding with nanostructure is one of the preferred embodiment in the present invention without limitation to the generality of the foregoing. Just only the efficacy and technical advantage generated by the nanostructure reproduced from the molding are the same as the preferred embodiment, they are regarded as the equivalent variation or modification to the present invention;

Furthermore, an adhesion layer (7) is further uniformly coated on the surface of the solar cell (8) before affixing the nanostructured film, when the first optical layer (3) and the second optical layer (6) are PDMS. As referring to FIG. 9, a schematic drawing for spin-coating an adhesion layer of an embodiment of a method for manufacturing a solar cell with a nanostructural film according to the present invention. The preferred embodiment in the present invention uses a spin coater to coat PDMS on the surface of the solar cell (8) as the adhesion layer (7) at 1000 rpm;

Step five (S5): affixing the concave spherical nanostructured film (31) on the surface of the solar cell (8) to manufacture a solar cell (8) with nanostructure after curing by baking; as referring to FIG. 10, a schematic drawing for formation of a solar cell of an embodiment of a method for manufacturing a solar cell with a nanostructural film according to the present invention, wherein the concave spherical nanostructured film (31) of PDMS in the preferred embodiment on the present invention is adhered on the surface of the PDMS adhesion layer (7). In addition, the above three nanostructured film can be separately affixed on the surface of the adhesion layer (7) to manufacture a solar cell (8) with nanostructure and the effect of the light gathering or light scattering after backing temperature ranging from 90° C. to 110° C. and time ranging from 30 minutes to 1 hour, and preferably is at 90° C. for 1 hour. The structure of the solar cell (8) allows light to pass through the nanostructure for generating the properties of scattered and aggregation and increasing traveling path. The light absorption rate of the element is also increased to enhance the current density of the short, and ultimately enhances the photoelectric conversion efficiency of the solar cell (8). However, if the first optical layer (3) and the second optical layer (6) in another embodiment of the present invention are made of EVA, and the nanostructured film can be flat on the surface of the solar cell (8) without using the adhesion layer (7) for adhering.

Figure 9:
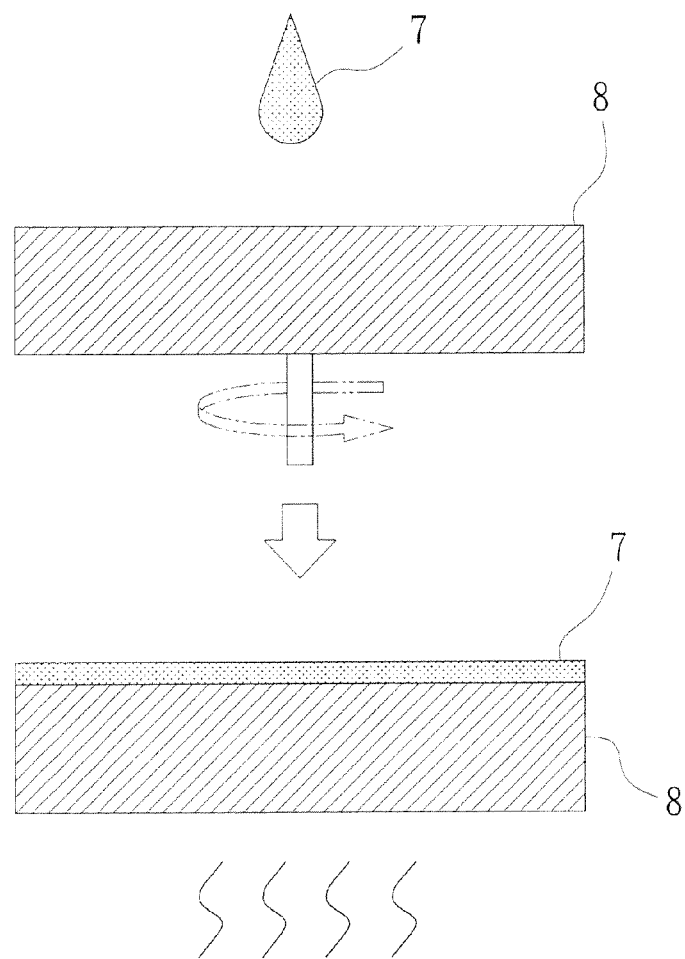
FIG. 9 is a schematic drawing for spin-coating an adhesion layer of an embodiment of a method for manufacturing a solar cell with a nanostructural film according to the present invention.
Figure 11:
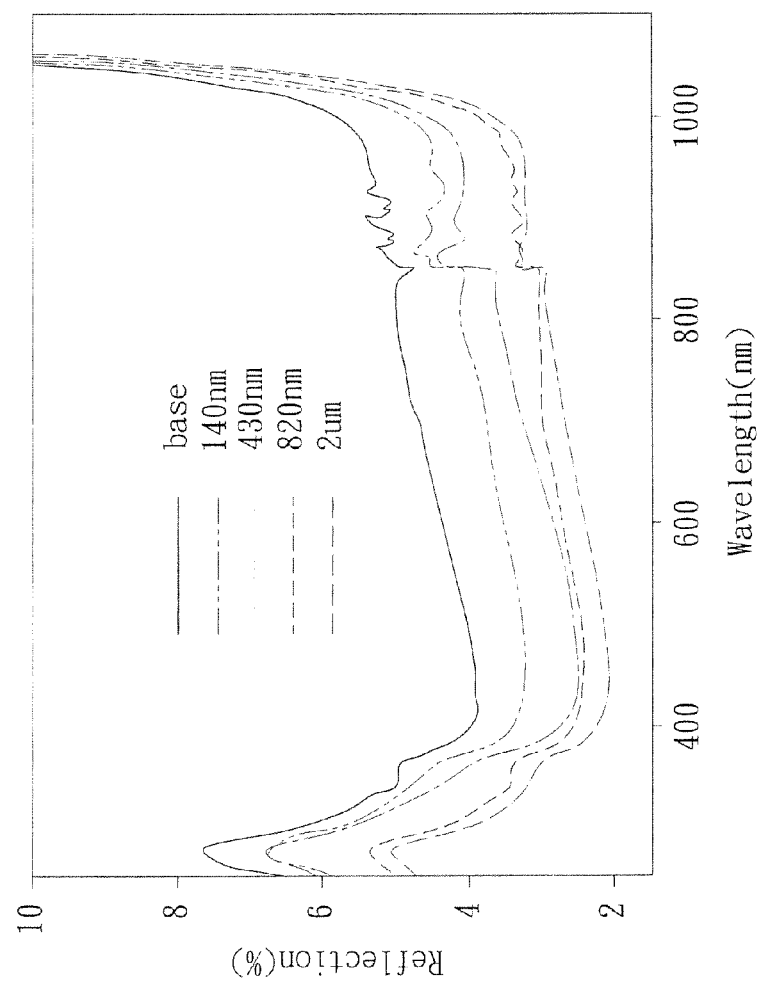
FIG. 11 shows the reflection rate of the concave spherical nanostructured film of a solar cell according to an embodiment of the present invention.
Figure 12:
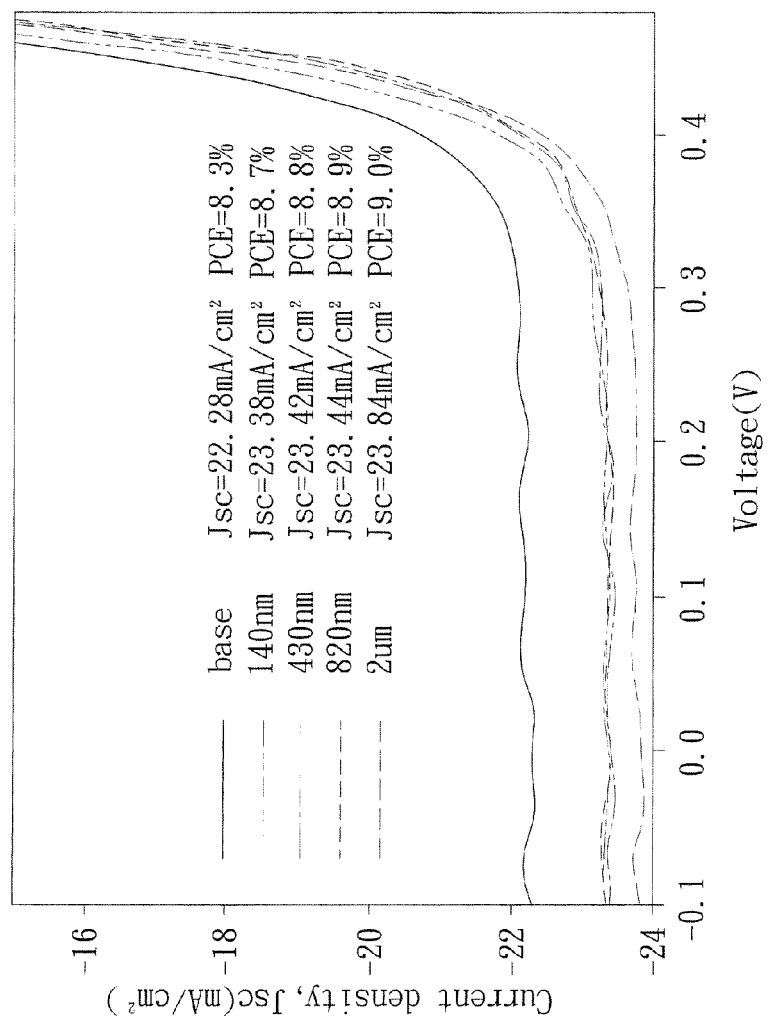
FIG. 12 is a diagram illustrating electrical characteristics of an exemplary solar cell formed with the concave spherical nanostructured film shown in FIG. 5.
Figure 13:
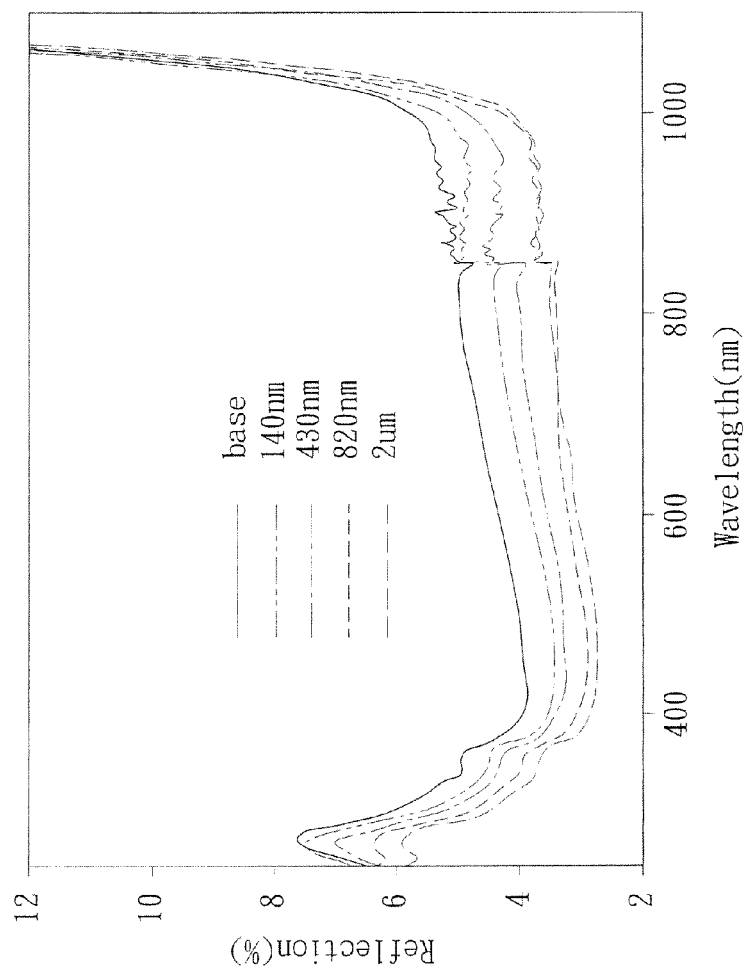
FIG. 13 shows the reflection rate of the convex spherical nanostructured film of a solar cell according to an embodiment of the present invention.
Figure 14:
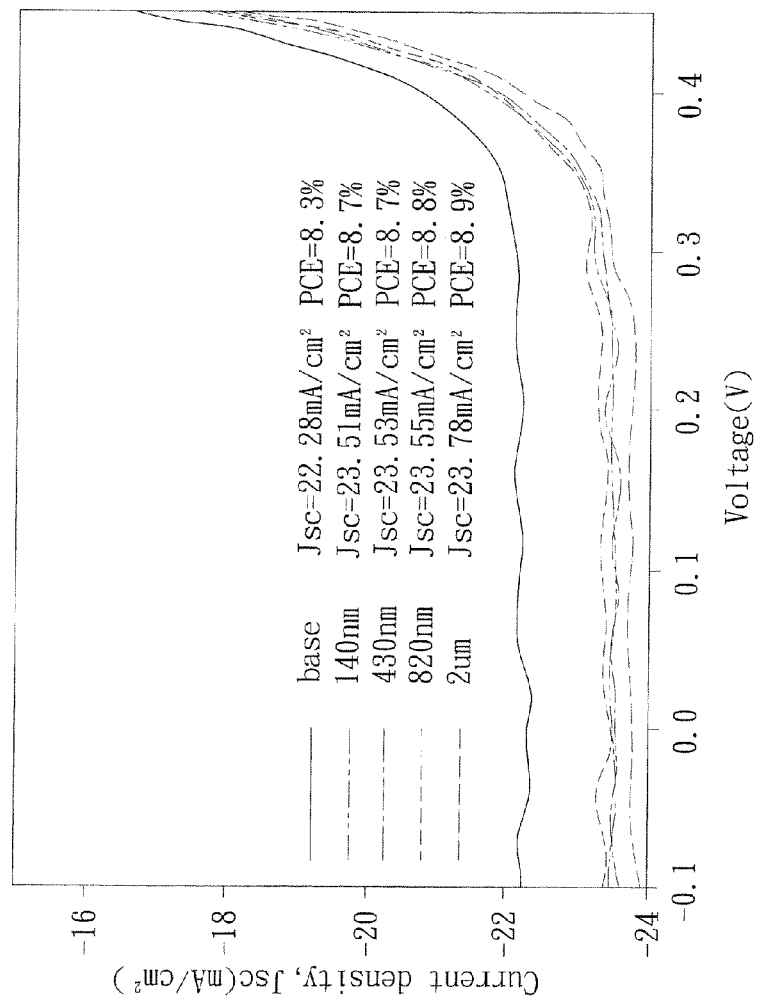
FIG. 14 is a diagram illustrating electrical characteristics of an exemplary solar cell formed with the convex spherical nanostructured film shown in FIG. 8.
Figure 15:
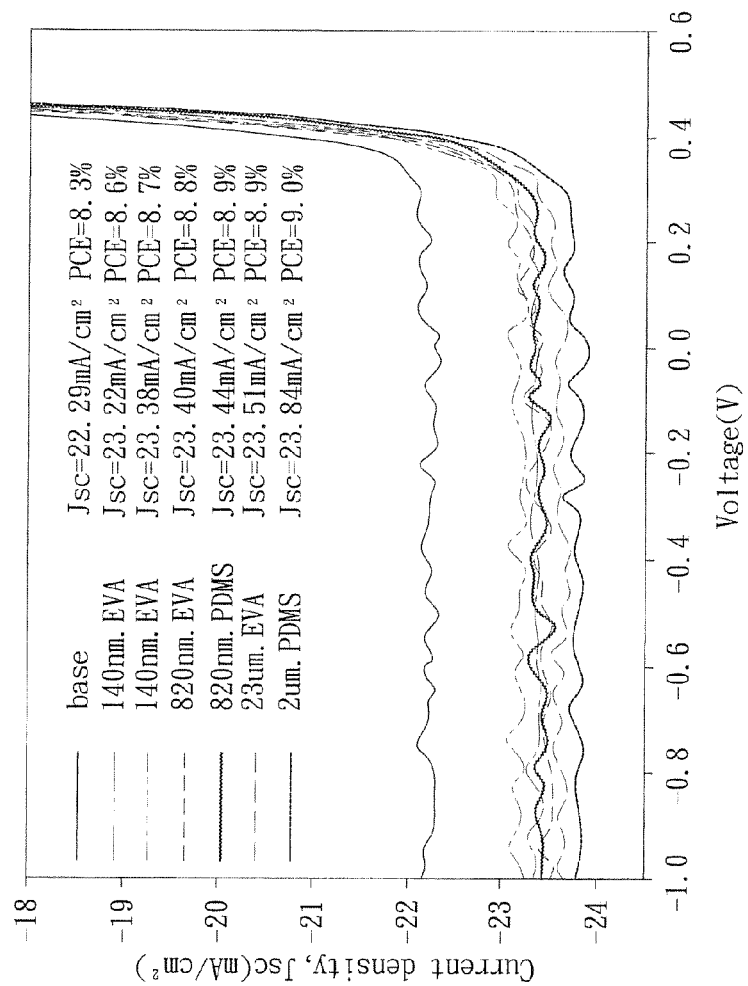
FIG. 15 is a diagram illustrating comparative electrical characteristics of exemplary solar cells respectively formed with the adhesion layer of PDMS or EVA as shown in FIG. 9.

According to the above method for manufacturing a solar cell with a nanostructural film for practical implementation, when different diameter of the polystyrene nanospheres (21) manufactures different size of the nanostructured film and applies to a solar cell (8), the photoelectric conversion efficiency is enhanced and the reflectance is also significant improved. Taking the preferred embodiment on the present invention as example, it uses the polystyrene nanospheres (21) with diameters of 140 nm, 430 nm, 820 nm and 2 um to carry out the example for enhancing the photoelectric conversion efficiency. As referring to FIG. 11, shows the reflection rate of the concave spherical nanostructured film of a solar cell according to an embodiment of the present invention, wherein the base is expressed as the reflection rate of solar cell (8) without nanostructured film, 140 nm is expressed as the reflection rate of solar cell (8) with the concave spherical nanostructured film (31) manufactured by the 140 nm polystyrene nanospheres (21), 430 nm is expressed as the reflection rate of solar cell (8) with the concave spherical nanostructured film (31) manufactured by the 430 nm polystyrene nanospheres (21), 820 nm is expressed as the reflection rate of solar cell (8) with the concave spherical nanostructured film (31) manufactured by the 820 nm polystyrene nanospheres (21), and 2 um is expressed as the reflection rate of solar cell (8) with the concave spherical nanostructured film (31) manufactured by the 2 um polystyrene nanospheres (21). As the average reflection rate of the visible light region with the wavelength ranging from 400 nm to 800 nm, the average reflection rate of the solar cell (8) without a nanostructured film is 4.5%, the average reflection rate of the concave spherical nanostructured film (31) manufactured by the optical layer of PDMS in the present invention can be enhanced to 3%. In addition, as referring to FIG. 12, a diagram illustrating electrical characteristics of an exemplary solar cell formed with the concave spherical nanostructured film shown in FIG. 5, wherein the type of the nanostructured film represented of each line is the same as FIG. 11. The results from the figure showing that open circuit voltage ($V_{oc}$) and filling factor (FF) are not increased, the current density is enhanced from 22.28 mA/cm$^2$ of non-nanostructure film to 23.84 mA/cm$^2$ of PDMS concave spherical nanostructured film (31) manufactured by 2 um polystyrene nanospheres (21), the enhancing effect is to 7%. And the photovoltaic conversion efficiency (PCE) is enhanced from 8.3% to 9%. In addition, the convex spherical nanostructured film (61) manufactured by PDMS also has the same effect. As referring to FIG. 13, shows the reflection rate of the convex spherical nanostructured film of a solar cell according to an embodiment of the present invention, wherein the type of the nanostructured film represented of each line is also the same as FIG. 11. As the average reflection rate of the visible light region with the wavelength ranging from 400 nm to 800 nm, the average reflection rate of the solar cell (8) is enhanced from 4.5% of non-nanostructure film to 3% of the convex spherical nanostructured film (61) manufactured by PDMS. As referring to FIG. 14, a diagram illustrating electrical characteristics of an exemplary solar cell formed with the convex spherical nanostructured film shown in FIG. 8, wherein the current density of the solar cell (8) with the convex spherical nanostructured film (61) manufactured by 2 um polystyrene nanospheres (21) is 23.78 mA/cm$^2$, and the enhancing effect is to 7%. PCE is also enhanced to 8.9%. Therefore, whether the concave spherical nanostructured film (31) or the convex spherical nanostructured film (61), the difference of the enhancing range between both are not obvious. In addition, as referring to FIG. 15, a diagram illustrating comparative electrical characteristics of exemplary solar cells respectively formed with the adhesion layer of PDMS or EVA as shown in FIG. 9, wherein the base is expressed as the solar cell (8) without nanostructured film, 140 nm. EVA and 140 nm. PDMS are expressed as the solar cell (8) with the concave spherical nanostructured film (31) manufactured by 140 nm polystyrene nanospheres (21) mixed EVA and PDMS optical layer, 820 nm. EVA and 820 nm. PDMS are expressed as the solar cell (8) with the concave spherical nanostructured film (31) manufactured by 820 nm polystyrene nanospheres (21) mixed EVA and PDMS optical layer, 2 um. EVA and 2 um. PDMS are expressed as the solar cell (8) with the concave spherical nanostructured film (31) manufactured by 2 um polystyrene nanospheres (21) mixed EVA and PDMS optical layer. Taking the concave spherical nanostructured film (31) manufactured by 2 um polystyrene nanospheres (21) as example, the optical layer manufactured by PDMS or EVA can enhance the current density ranging from 5% to 7% in the solar cell (8), and PCE is enhanced from 8.3% to 9%. From the experimental results showing, all of solar cell (8) with the nanostructured film can effectively enhance the photovoltaic conversion efficiency, whether there is a nanostructured film or not, even if a pure optical layer is coated on the solar cell (8) also slightly improves the photoelectric conversion efficiency. The enhanced efficiency is more obvious after coating a nanostructured film, and whether any type of the nanostructured film can achieve the purpose of enhancing the photoelectric conversion efficiency of the solar cell (8). In addition, since the difference of the enhanced range by the concave spherical nanostructured film (31) or convex spherical nanostructured film (61) is insignificant, it means that whether light gathering or light scattering can increase the path of light to enhance the absorption of light in the solar cell and effectively to improve the current density.

Compared with techniques available now, the present invention has the following advantages:
1. The present invention uses a mold having a nanostructured surface to prepare the nanostructural film by imprint molding in cooperation with optical layers each having a refractive index between those of the substrate and air. The nanostructural film can be directly affixed on the surface of the solar cell so that the solar cell generates the light concentration effect to increase routes through which the light inside the solar cell travel, effectively reduce the light reflectivity and enhance the photoelectric conversion efficiency thereof.

2. The present invention uses materials of ethylene vinyl acetate (EVA) or poly(dimethylsiloxane) (PDMS) to prepare the optical layers in manufacture of the nanostructured film. Unlike traditional nanostructures mostly manufactured by the lithography process of the semiconductor industry, the method of the present invention can be repeatedly done in a general environment without special and expensive equipment or devices; in other words, it is simplified to save much more costs for manufacturing solar cells.

3. A concave or convex spherical manostructural film or other films having various spherical nanostructures can be used in the present invention to enhance the photoelectric conversion efficiency of the solar cell. Owing to no significant results for use of concave spherical nanostructure or convex spherical nanostructure in enhancing the photoelectric conversion efficiency of the solar cell, either light gathering or light scattering enable to increase routes of light to further enhance the light absorption and effectively improve the current density of the solar cell.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method for manufacturing a solar cell with a nanostructural film prepared by an imprint molding process to enhance light absorption of the solar cell, comprising:
    treating a glass substrate with UV ozone;
    uniformly coating a polystyrene nanospherical layer containing a plurality of nanospheres on the surface of the glass substrate and curing the polystyrene nanospherical layer for adhesion onto the glass substrate;
    forming a first optical layer on the surface of the polystyrene nanospherical layer;
    curing the first optical layer;
    releasing the first optical layer from the polystyrene nanospherical layer to obtain a concave spherical nanostructured film; and
    affixing the concave spherical nanostructured film on the surface of the solar cell to manufacture a solar cell with nanostructure.

2. The method as claimed in claim 1, wherein the first optical layer is made of ethylene vinyl acetate (EVA) or poly(dimethylsiloxane) (PDMS).

3. The method as claimed in claim 2, further comprising, before affixing the concave spherical nanostructured film, uniformly coating an adhesion layer of PDMS on the surface of the solar cell,
    wherein the concave spherical nanostructured film is affixed via the adhesion layer of PDMS.

4. The method as claimed in claim 1, wherein the UV ozone is used to clean the surface of the glass substrate as a cleaning technology, so that the glass substrate has a hydrophilic surface to make polystyrene nanospheres attach thereto.

5. The method as claimed in claim 1, wherein each of the polystyrene nanospheres has a diameter ranging from 140 nm to 2 μm.

6. The method as claimed in claim 1, wherein the curing of the first optical layer is carried out by a baking process at a temperature ranging from 90° C. to 110° C.

7. The method as claimed in claim 1, further comprising, after affixing the concave spherical nanostructured film, curing the concave spherical nanostructured film by a baking process at a temperature ranging from 90° C. to 110° C.

8. A method for manufacturing a solar cell with a nanostructural film prepared by an imprint molding process to enhance light absorption of the solar cell, comprising:
    treating a glass substrate with UV ozone;
    uniformly coating a polystyrene nanospherical layer containing a plurality of nanospheres on the surface of the glass substrate and curing the polystyrene nanospherical layer for adhesion onto the glass substrate;
    forming a first optical layer on the surface of the polystyrene nanospherical layer;
    curing the first optical layer;
    releasing the first optical layer from the polystyrene nanospherical layer to obtain a concave spherical nanostructured film;
    forming a second optical layer on the surface of the concave spherical nanostructured film;
    curing the second optical layer;
    releasing the second optical layer from the concave spherical nanostructured film to obtain a convex spherical nanostructured film; and
    affixing the convex spherical nanostructured film on the surface of the solar cell to manufacture a solar cell with nanostructure.

9. The method as claimed in claim 8, wherein the second optical layer is made of ethylene vinyl acetate (EVA) or poly(dimethylsiloxane) (PDMS).

10. The method as claimed in claim 9, further comprising, before affixing the convex spherical nanostructured film, uniformly coating an adhesion layer of PDMS on the surface of the solar cell,
    wherein the convex spherical nanostructured film is affixed via the adhesion layer of PDMS.

11. The method as claimed in claim 8, wherein the curing of the second optical layer is carried out by a baking process at a temperature ranging from 90° C. to 110° C.

12. The method as claimed in claim 8, further comprising, after affixing the convex spherical nanostructured film, curing the convex spherical nanostructured film by a baking process at a temperature ranging from 90° C. to 110° C.

* * * * *